(12) United States Patent
Liang

(10) Patent No.: US 7,333,347 B1
(45) Date of Patent: Feb. 19, 2008

(54) SCREWING CONTROL DEVICE OF A COMPUTER CHASSIS

(75) Inventor: Chien-Kuo Liang, Chung-Ho (TW)

(73) Assignee: Ablecom Computer Inc., San Jose, CA (US)

( * ) Notice: Subject to any disclaimer, the term of this patent is extended or adjusted under 35 U.S.C. 154(b) by 0 days.

(21) Appl. No.: 11/640,248

(22) Filed: Dec. 18, 2006

(51) Int. Cl.
*H05K 7/04* (2006.01)

(52) U.S. Cl. ............ 361/810; 361/752; 361/753; 174/177

(58) Field of Classification Search ............ 361/683, 361/736, 742, 758, 787, 809, 810; 174/138 D, 174/138 G, 166 S
See application file for complete search history.

(56) References Cited

U.S. PATENT DOCUMENTS

| | | | | |
|---|---|---|---|---|
| 3,488,628 A | * | 1/1970 | Lundergan et al. | 439/853 |
| 5,115,375 A | * | 5/1992 | Garay | 361/760 |
| 5,671,124 A | * | 9/1997 | Ho | 361/758 |
| 6,005,402 A | * | 12/1999 | Grasso | 324/754 |
| 6,061,240 A | * | 5/2000 | Butterbaugh et al. | 361/704 |
| 6,140,591 A | * | 10/2000 | Osborne et al. | 174/138 E |
| 6,376,776 B2 | * | 4/2002 | Akizuki | 174/138 G |
| 6,377,445 B1 | * | 4/2002 | Davis et al. | 361/683 |
| 6,404,646 B1 | * | 6/2002 | Tsai et al. | 361/758 |
| 6,493,233 B1 | * | 12/2002 | De Lorenzo et al. | 361/752 |
| 6,615,459 B2 | * | 9/2003 | Sano | 24/453 |
| 2004/0131444 A1 | * | 7/2004 | Franco et al. | 411/352 |
| 2006/0077642 A1 | * | 4/2006 | Estes et al. | 361/752 |

\* cited by examiner

*Primary Examiner*—Tuan T. Dinh
*Assistant Examiner*—Xiaoliang Chen
(74) *Attorney, Agent, or Firm*—Pro-TECHTOR Int'l Services

(57) ABSTRACT

A screwing control device of a computer chassis is composed of a computer chassis, a panel of which is pre-built with a plurality of positioning holes; a screw element, a center of which is provided with a screw hole and which is able to be locked and fixed into one of the positioning holes; and a bolt, which is transfixed into a through-hole of a board element, and is then screwed into the screw hole of the screw element. Therefore, a quantity of the screw elements which are actually used for screwing can be effectively controlled, and pre-built projected bolts which are not necessarily used for screwing can be eliminated.

5 Claims, 6 Drawing Sheets

SCREWING CONTROL DEVICE OF A COMPUTER CHASSIS

BACKGROUND OF THE INVENTION a) Field of the Invention

The present invention relates to a screwing control device of a computer chassis, and more particularly to a computer chassis, a panel surface of which is pre-built with a plurality of positioning holes, wherein a screw element with a central screw-hole can be optionally locked and positioned into one of the positioning holes which is at a proper position, so as to decrease a number of fixed bolts and to remove an obstacle which occurs upon installing components in the computer chassis, by screwing the screw element with other board element (such as a circuit board).

b) Description of the Prior Art

Referring to FIG. 7, a bottom panel E of a conventional computer chassis is riveted with a plurality of fixed bolts A, wherein a connection line A1 is used to represent that the bolt A is fixed and riveted with the panel E into one body; in other words, a center of the bolt A is provided with a female thread A2, such that the fixed bolt A can be screwed with a through-hole C1 in a circuit board C of a constant length and a constant width through a bolt B, in order to fix the circuit board C on the bottom panel E. However, a shortcoming is that the bottom panel E must be pre-punched with holes and then the bolts A are punched again to be riveted and fixed on the bottom panel E; therefore, the surface of the bottom panel E must be protruded and fixed with a lot of bolts A. When a number and positions of connection holes C1 of various sizes on the circuit board C are different; for example, if a new circuit board C of different size is to be installed on the bottom panel E, the excessive fixed bolts which are not used cannot be eliminated, which forms a new obstacle and prohibits these fixed bolts from being screwed and fixed with the connection holes C1 on the circuit board C. More particularly, in fact there are less than ⅔ of a total number of the projected fixed bolts that are actually used in a screwing condition, and the rest ⅓ are pre-built. Therefore, the unused bolts A may cause a huge waste.

SUMMARY OF THE INVENTION

The primary object of present invention is to provide a screwing control device of a computer chassis, wherein a panel surface of the computer chassis is punched into a plurality of positioning holes according to different distances, a screw element can be optionally locked and positioned into one of the positioning holes, and a bolt can be transfixed (or screwed) into other board element and screwed into a screw-hole of the screw element, such that a number of the screw elements that are actually used for screwing can be effectively controlled, and pre-built projected bolts that are not necessary can be eliminated.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
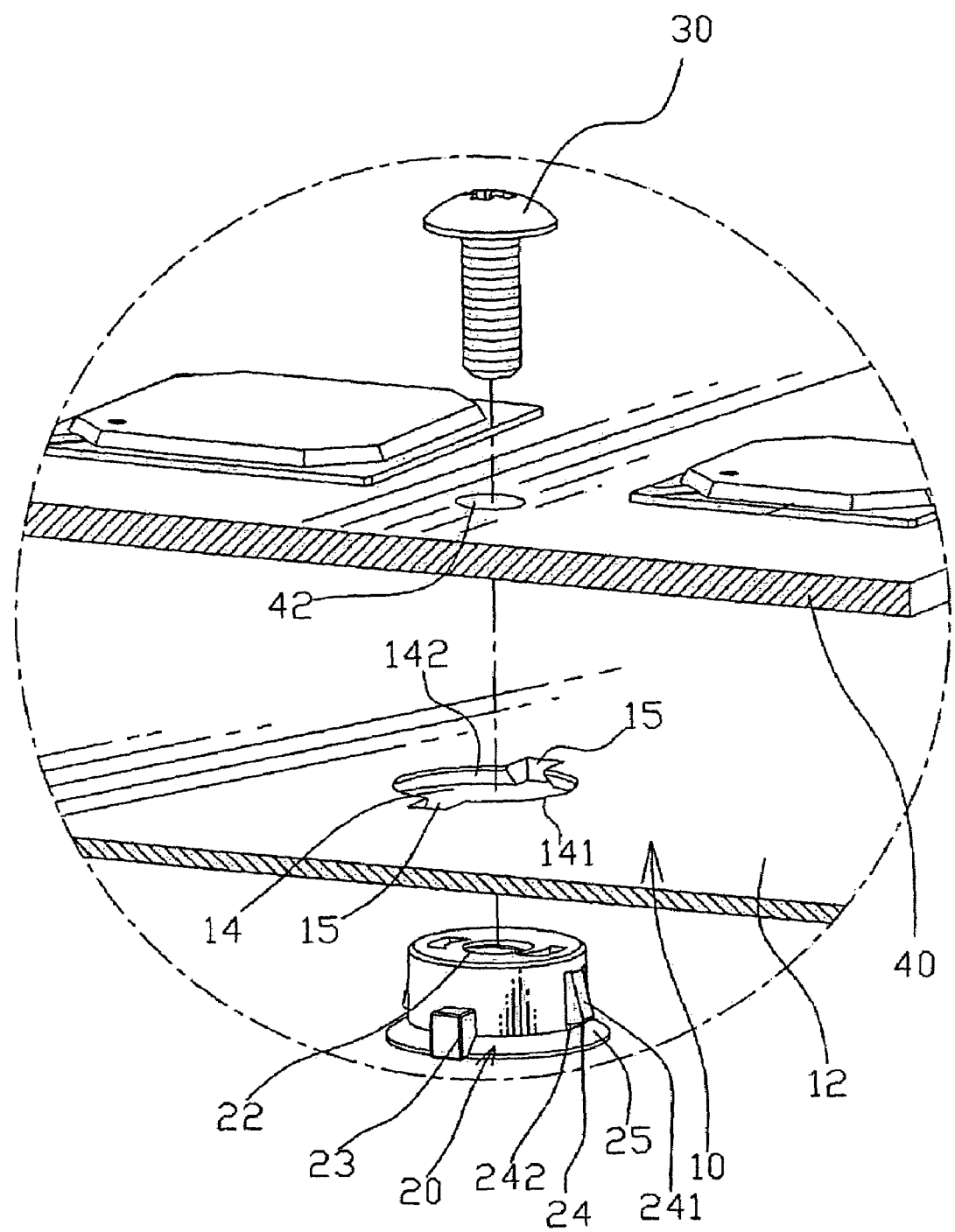
FIG. 1 shows an exploded view of a screw element being screwed with a board element according to the present invention.
Figure 4:
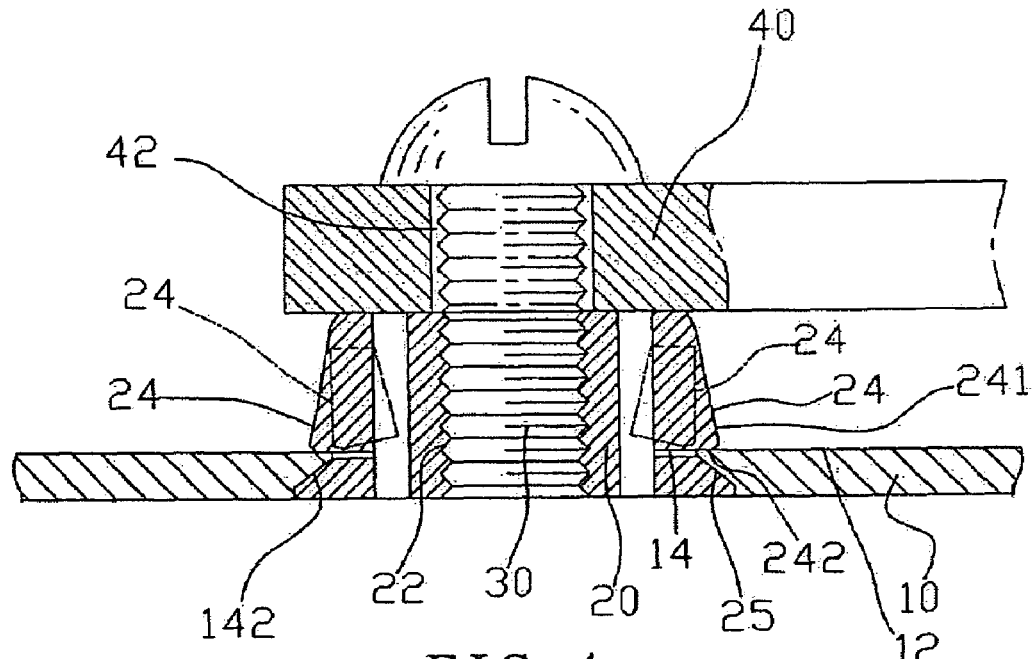
FIG. 4 shows a sectional view after a screw element is screwed with a board element according to the present invention.
Figure 5:
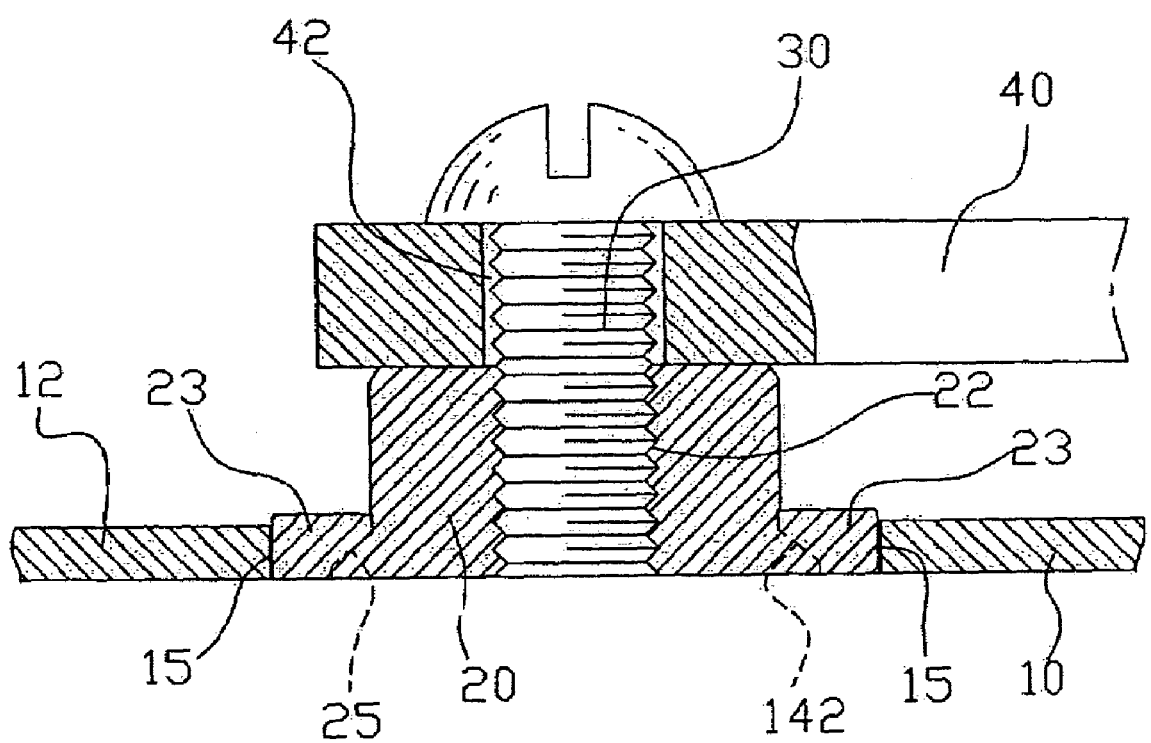
FIG. 5 shows another sectional view after a screw element is screwed with a board element according to the present invention.
Figure 6:
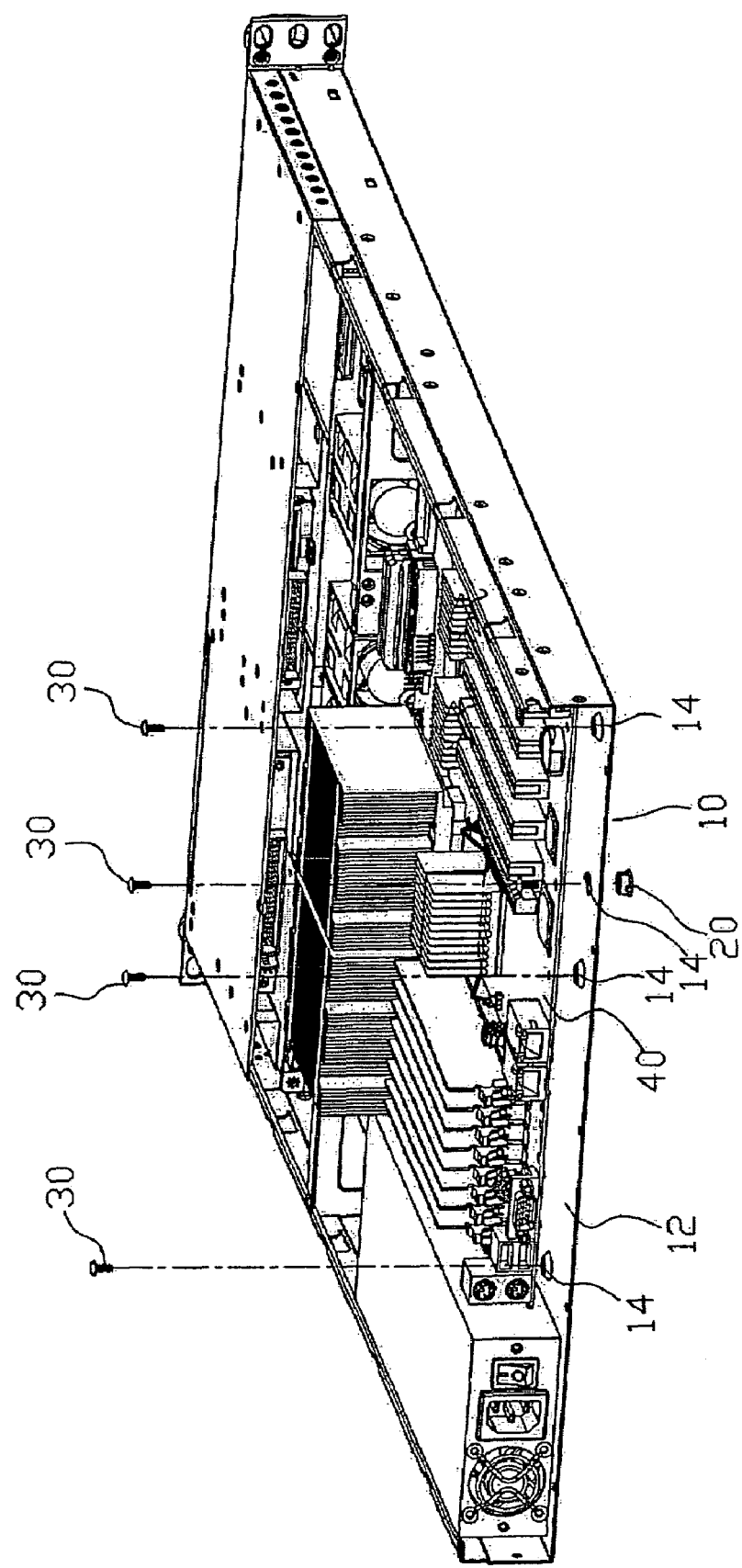
FIG. 6 shows an exploded view of a screw element being positioned at a component of a computer chassis according to the present invention.
Figure 7:
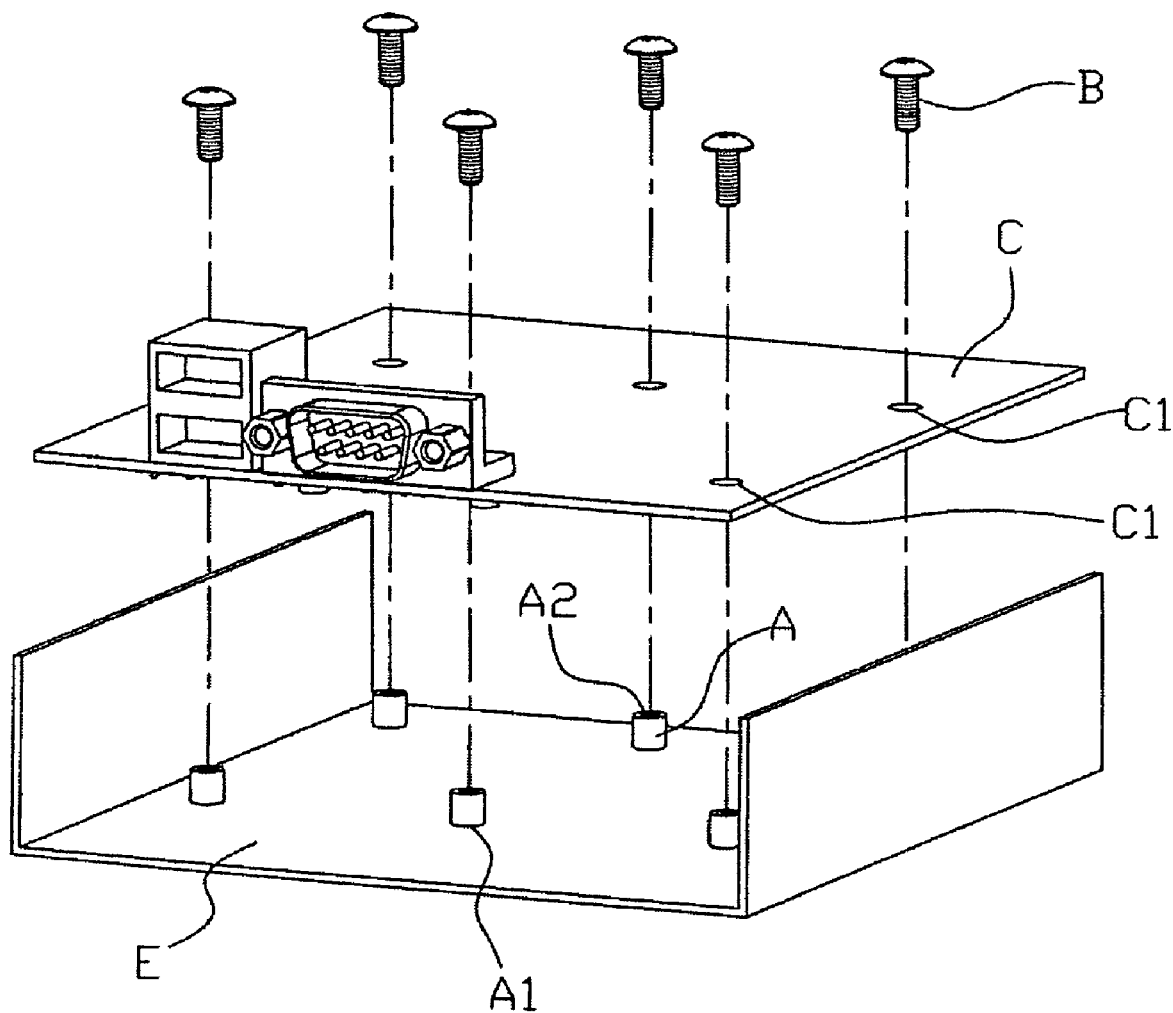
FIG. 7 shows an exploded view of components of a prior art.

Referring to FIG. 1 and FIG. 6, the present invention is to provide a screwing control device of a computer chassis, including a computer chassis 10, a panel 12 of which is pre-built with a plurality of positioning holes 14; a screw element 20, a center of which is provided with a screw-hole 22, and which is able to be locked and fixed into one positioning hole 14; and a bolt 30, which is transfixed into a through-hole 42 of a board element 40 and is then screwed into the screw-hole 22 of the screw element 20. The screw element 20 is a cylinder, a side of which is integrally formed with at least one projected blocks 23 and is integrally formed with at least one slant projected blocks 24 which can be displaced flexibly. A rim of the positioning hole 14 is provided with at least one extended notches 15, the projected block 23 can be transfixed from the notch 15, the slant projected block 24 can be deformed elastically to pass through a circumference 141 of the positioning hole 14, and a bottom end 242 of the slant projected block 24 can be locked and positioned on a surface of the panel 12 at an outer circumference of the positioning hole 14 (as shown in FIG. 4), enabling the entire screw element 20 to be positioned on the panel 12.

Referring to FIG. 1, the board element 40 can be a circuit board, and the through-hole 42 of the board element 40 can be also designed as a screw-hole.

The circumference of the positioning hole 14 is provided with an inner cone surface 142, a circumferential surface surrounding a bottom end of the screw element 20 is formed with a convex cone surface 25 which can be fitted with and transfixed into the inner cone surface 142, and the projected block 23 is positioned into the notch 15.

The screw element 20 can be made by non-metallic plastic material.

An upper end of the slant projected block 24 is integrally connected with the screw element 20, and a left and right sides, as well as a bottom end of the slant projected block 24 are not connected with the screw element 20 to form a bare state, thereby enabling the projected block 24 to form into an elastic element.

Figure 2:
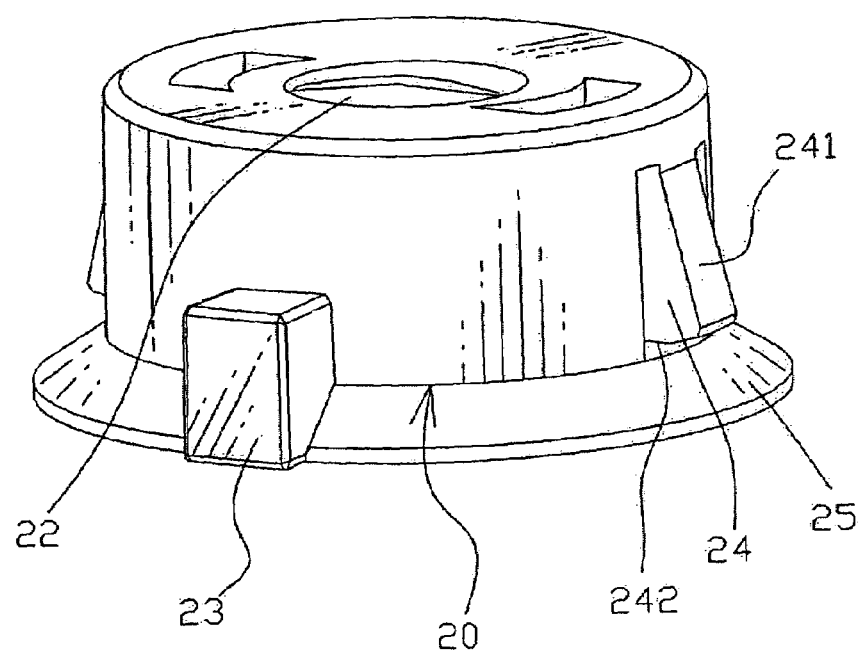
FIG. 2 shows a perspective view of a screw element according to the present invention.

Referring to FIG. 1 and FIG. 2, a screw element 20 is basically a plastic cylinder, and a plurality of positioning holes 14 is configured on a panel 12 of a computer chassis 10, according to required quantity and distances of a designer. A board element 40 can be a circuit board or other board-shape material, and is provided with a plurality of through-holes 42 corresponding to the positioning holes 14.

Figure 3:
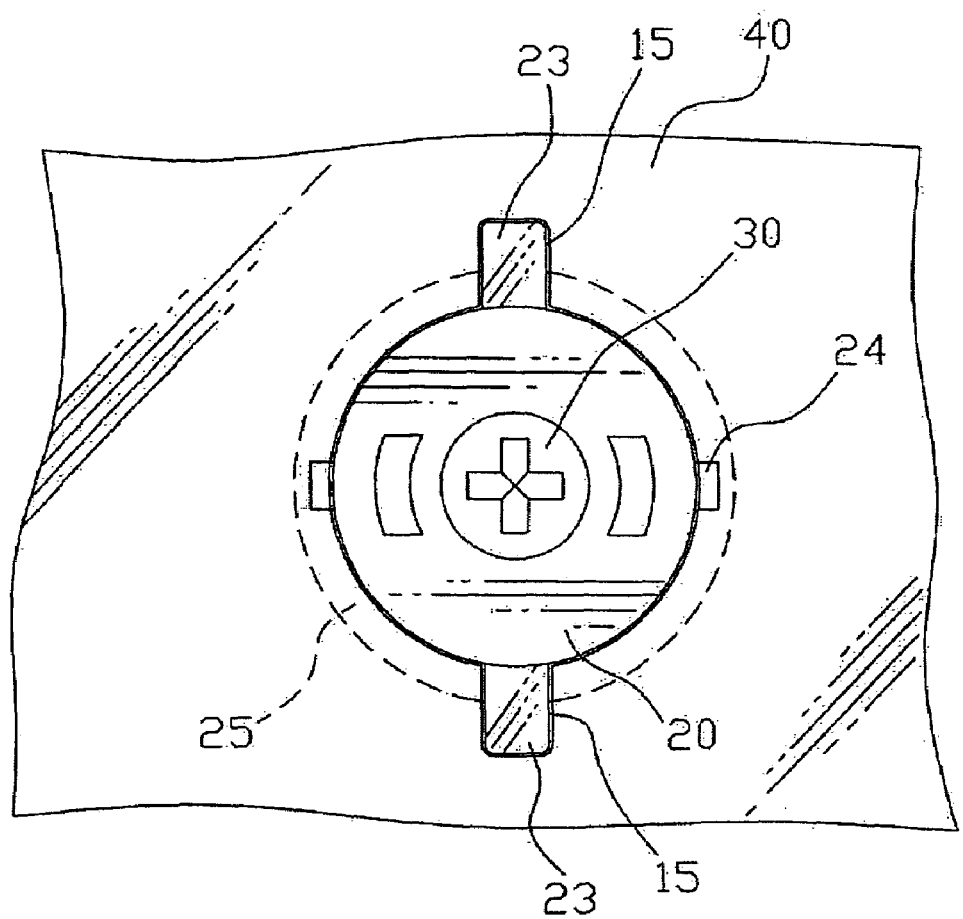
FIG. 3 shows a local plan view after a screw element is screwed with a board element according to the present invention.

Two projected blocks 23 of a screw element 20 are correspondingly extended into two notches 15 (as shown in FIG. 3), a slant projected block 24 is made by plastic material and its three sides are all bare, with only an upper end being connected on the screw element 20. Therefore, the slant projected block 24 forms into an elastic element. Referring to FIG. 3 and FIG. 4, when an outer slant surface 241 is squeezed at a circumference of the positioning hole 14, it is in an elastic compression state. When the outer slant surface 241 is moved to a space above the positioning hole 14, moment of compression force will disappear, and the slant projected block 24 will be quickly restored elastically, which enables a bottom end 242 to touch on the panel 12, thereby allowing the entire screw element 20 to be positioned into one of the plural positioning holes 14, and the two projected blocks 23 to be locked into two notches 15, in order to let the screw element 20 to be subjected to force without rotating freely, and enable the convex cone surface 25 to be fitted with and connected into the inner cone surface 142. In addition, a bolt 30 is transfixed into the through-hole 42 of the board element 40, and is screwed into a screw-hole 22; therefore, the board element 40 is fixed on the screw element 20 and the computer chassis 10.

On the other hand, when the screw element 20 is to be taken out of the computer chassis 10, as shown in FIG. 4, under a condition that the board element 40 and the bolt 30 are eliminated, just by using a tool (such as a screwdriver) to exert pressure on the two outer slant surfaces 241 respectively, that the two slant projected blocks 24 can be elastically deformed inward, respectively. Next, the screw element 20 is pressed down a little, and then the two slant projected blocks 24 will be correspondingly in touch with circumferences 141 of the positioning holes 14, thus the entire screw element 20 can be taken out from top. Therefore, the screw element 20 can be assembled at and dismantled from a certain positioning hole 14, thereby being able to eliminate a shortcoming of a prior art where bolts should be pre-built. In particular, the present invention can accurately and effectively employ and control the quantity of screw elements 20, without wasting the screw elements, nor interfering with a circuit board or other parts like fixed, excessive and projected bolts in the prior art will do.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A screwing control device of a computer chassis, comprising:

a chassis, a panel of which is pre-built with a plurality of positioning holes in a circular shape, the panel having a lower surface and an upper surface; a screw element, which is a cylinder, a center of which is provided with a screw-hole, a side of which is integrally formed with at least one projected block and is integrally formed with at least one slant projected block that is displaced elastically, and which is locked and positioned into one of the positioning holes, with a rim of the positioning hole being provided with at least one extended notch, allowing the projected block to be transfixed from the notch, the slant projected block being deformed elastically to pass through a circumference of the positioning hole, and a bottom end of the slant projected block being locked and positioned on a surface of the panel at an outer circumference of the positioning hole, such that the entire screw element is positioned on the panel; and a bolt, which is transfixed into a through-hole of a board element, and is then screwed into the screw-hole of the screw element, wherein the screw element is configured to be removed from the upper surface of the panel.

2. The screwing control device of a computer chassis according to claim 1, wherein the board element is a circuit board, and the through-hole of the board element is also designed as a screw-hole.

3. The screwing control device of a computer chassis according to claim 1, wherein the circumference of the positioning hole is provided with an inner cone surface, a circumferential surface surrounding a bottom end of the screw element is formed with a convex cone surface which is fitted with and transfixed into the inner cone surface, and the projected block is positioned into the notch.

4. The screwing control device of a computer chassis according to claim 1, wherein the screw element is made by non-metallic plastic material.

5. The screwing control device of a computer chassis according to claim 1, wherein an upper end of the slant projected block is integrally connected with the screw element, and a left and right sides, as well as a bottom end of the slant projected block are not connected with the screw element to form a bare state, thereby enabling the projected block to form into an elastic element.

\* \* \* \* \*